(12) United States Patent
Sridhar et al.

(10) Patent No.: US 8,470,675 B2
(45) Date of Patent: Jun. 25, 2013

(54) THICK GATE OXIDE FOR LDMOS AND DEMOS

(75) Inventors: Seetharaman Sridhar, Richardson, TX (US); Sameer Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 51 days.

(21) Appl. No.: 13/274,698

(22) Filed: Oct. 17, 2011

(65) Prior Publication Data

US 2012/0100679 A1    Apr. 26, 2012

Related U.S. Application Data

(60) Provisional application No. 61/394,949, filed on Oct. 20, 2010.

(51) Int. Cl.
*H01L 21/8234* (2006.01)

(52) U.S. Cl.
USPC ........... 438/275; 438/142; 438/286; 438/505; 438/787; 257/E21.417; 257/E21.625; 257/E21.644

(58) Field of Classification Search
USPC ................ 438/142, 275, 216, 286, 305, 505, 438/773, 775, 787, FOR. 176, FOR. 192, 438/FOR. 431, FOR. 490; 257/E21.417, 257/E21.625, E21.644
See application file for complete search history.

(56) References Cited

U.S. PATENT DOCUMENTS

| | | | |
|---|---|---|---|
| 6,541,395 B1 * | 4/2003 | Trivedi et al. | 438/775 |
| 7,575,977 B2 * | 8/2009 | Levin et al. | 438/286 |
| 8,088,677 B2 * | 1/2012 | Tsutsui | 438/505 |
| 2001/0039093 A1 * | 11/2001 | Oohashi | 438/275 |
| 2002/0013067 A1 * | 1/2002 | Taniguchi et al. | 438/787 |
| 2007/0063273 A1 * | 3/2007 | Yoneda | 257/333 |

* cited by examiner

*Primary Examiner* — Thanh V Pham
(74) *Attorney, Agent, or Firm* — Jacqueline J. Garner; Wade J. Brady, III; Frederick J. Telecky, Jr.

(57) ABSTRACT

A process of forming an integrated circuit, including forming a dummy oxide layer for ion implanting low voltage transistors, replacing the dummy oxide in the low voltage transistor area with a thinner gate dielectric layer, and retaining the dummy oxide for a gate dielectric for a DEMOS or LDMOS transistor. A process of forming an integrated circuit, including forming a dummy oxide layer for ion implanting low voltage and intermediate voltage transistors, replacing the dummy oxide in the low voltage transistors with a thinner gate dielectric layer, replacing the dummy oxide in the intermediate voltage transistor with another gate dielectric layer, and retaining the dummy oxide for a gate dielectric for a DEMOS or LDMOS transistor.

20 Claims, 14 Drawing Sheets

US 8,470,675 B2

THICK GATE OXIDE FOR LDMOS AND DEMOS

FIELD OF THE INVENTION

This invention relates to the field of integrated circuits. More particularly, this invention relates to metal oxide semiconductor (MOS) transistors in integrated circuits.

BACKGROUND OF THE INVENTION

An integrated circuit may include source/drain symmetric MOS transistors which are structurally symmetric with respect to their source and drain nodes, and source/drain asymmetric MOS transistors such as drain extended MOS (DEMOS) or laterally diffused MOS (LDMOS) transistors which have drain structures capable of operating at higher voltages than the symmetric MOS transistors. The asymmetric MOS transistors may require thicker gate dielectric layer than the symmetric MOS transistors to provide desired levels of performance, such as on-state drive current and off-state leakage current, from each transistor. It may also be desirable to minimize the photolithographic operations performed during fabrication of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A process for fabricating an integrated circuit may include forming a dummy oxide layer, such as a pad oxide for shallow trench isolation (STI) field oxide or a screen oxide for threshold adjustment ion implantation steps. The dummy oxide is removed in areas defined for a source/drain symmetric MOS voltage transistor, and left in an area defined for a DEMOS and/or LDMOS transistor. Subsequently, a lower voltage MOS gate dielectric layer is formed for the symmetric MOS transistor in such a manner that the dummy oxide layer in the DEMOS/LDMOS transistor area provides a higher voltage gate dielectric layer for the DEMOS/LDMOS transistor. The higher voltage gate dielectric layer of the DEMOS/LDMOS transistor including the dummy oxide layer is thicker than the lower voltage MOS gate dielectric layer. The lower voltage MOS gate dielectric layer may be formed by growth of thermal oxide.

DETAILED DESCRIPTION

Figure 1A:
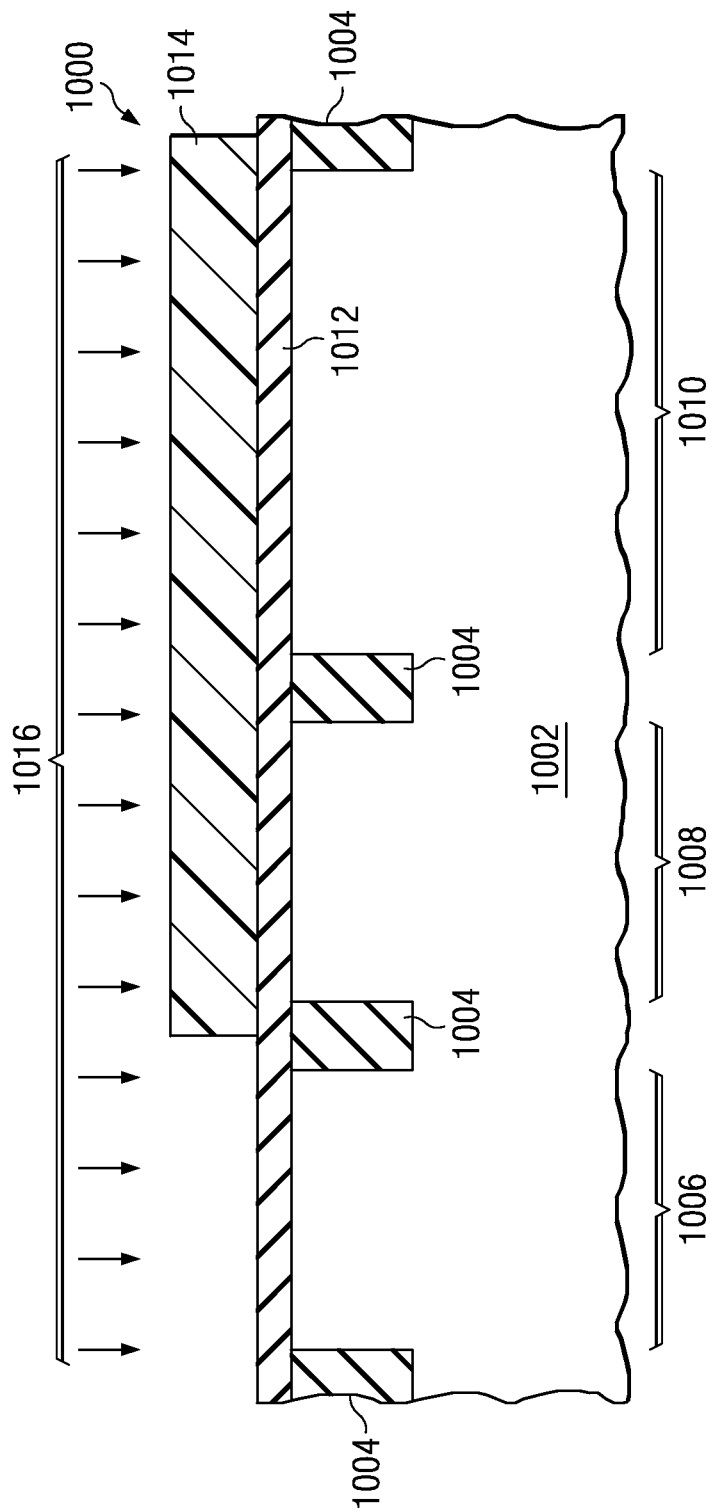
FIG. 1A through FIG. 1F are cross-sections of an integrated circuit formed according to a first embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may include one or more source/drain symmetric MOS transistors and one or more DEMOS and/or LDMOS transistors. In one example, an integrated circuit may include lower voltage symmetric n-channel MOS (NMOS) transistors and lower voltage symmetric p-channel MOS (PMOS) transistors which operate below 1.5 volts, and a DEMOS or LDMOS transistor which operates above 5 volts. In another example, an integrated may contain lower voltage symmetric NMOS and PMOS transistors which operate below 1.5 volts, input/output (I/O) symmetric NMOS and/or PMOS transistors which operate between 1.8 volts and 3.3 volts, and a DEMOS/LDMOS transistor which operates above 5 volts.

A process sequence for fabricating an integrated circuit may include forming a dummy oxide layer on a top surface of a substrate, such as a pad oxide for shallow trench isolation (STI) field oxide or a screen oxide for threshold adjustment ion implantation steps. Ion implantation operations, for example threshold adjustment implants into the symmetric NMOS and PMOS transistors, may be performed using photoresist masks which cover areas for the DEMOS/LDMOS transistor. The dummy oxide is removed in areas defined for the symmetric NMOS and PMOS transistors, and left in an area defined for the DEMOS/LDMOS transistor. Subsequently, a lower voltage MOS gate dielectric layer is formed for the symmetric MOS transistors in such a manner that the dummy oxide layer provides a suitable gate dielectric layer for the DEMOS/LDMOS transistor. The lower voltage MOS gate dielectric layer may be formed by growth of thermal oxide.

FIG. 1A through FIG. 1F are cross-sections of an integrated circuit formed according to a first embodiment, depicted in successive stages of fabrication. Referring to FIG. 1A, the integrated circuit is formed in and on a substrate 1002 which may be a single crystal silicon wafer, or a silicon-on-insulator (SOI) wafer, a hybrid orientation technology (HOT) wafer with regions of different crystal orientations, or other material appropriate for fabrication of the integrated circuit 1000. Elements of field oxide 1004 may be formed at a top surface of the substrate 1002, typically of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP). The field oxide elements 1004 may isolate areas defined for a symmetric NMOS transistor 1006, a symmetric PMOS transistor 1008 and a DEMOS/LDMOS transistor 1010.

A dummy oxide layer 1012 is formed on a top surface of the substrate 1002, in particular in the symmetric NMOS transistor 1006 area, the symmetric PMOS transistor 1008 area and the DEMOS/LDMOS transistor 1010 area. The dummy oxide layer 1012 may be, for example, a remaining oxide layer from an STI process sequence, or a screening oxide for ion implant processes, or a combination of both. In one realization of the instant embodiment, the dummy oxide layer may be more than 5 nanometers thick. In another realization, the dummy oxide layer may be more than 8 nanometers thick. In one realization of the instant embodiment, the dummy oxide layer 1012 may be formed by growing a thermal oxide layer which consumes a portion of a top layer of the substrate 1002. In another realization, the dummy oxide layer 1012 may be formed by depositing a layer of silicon oxide using chemical vapor deposition (CVD), plasma enhanced chemical vapor deposition (PECVD), low pressure chemical vapor deposition (LPCVD), atmospheric pressure chemical vapor deposition (APCVD), high density plasma (HDP), an ozone based thermal CVD process, or other suitable silicon oxide layer formation process, so that substantially none of the substrate 1002 is consumed. In a further realization, the dummy oxide layer 1012 may be formed by decomposition of tetraethyl orthosilicate, also known as tetraethoxysilane or TEOS. In yet another realization, the dummy oxide layer 1012 may be formed using methylsilsesquioxane (MSQ).

An NMOS ion implantation photoresist pattern 1014 is formed on a top surface of the dummy oxide layer 1012 so as to cover the DEMOS/LDMOS transistor 1010 area and expose the symmetric NMOS transistor 1006 area. The NMOS ion implantation photoresist pattern 1014 may also cover the symmetric PMOS transistor 1008 area. An NMOS ion implantation process 1016 is performed while the NMOS ion implantation photoresist pattern 1014 is in place so that NMOS dopants are implanted into the symmetric NMOS transistor 1006 area.

Figure 1B:
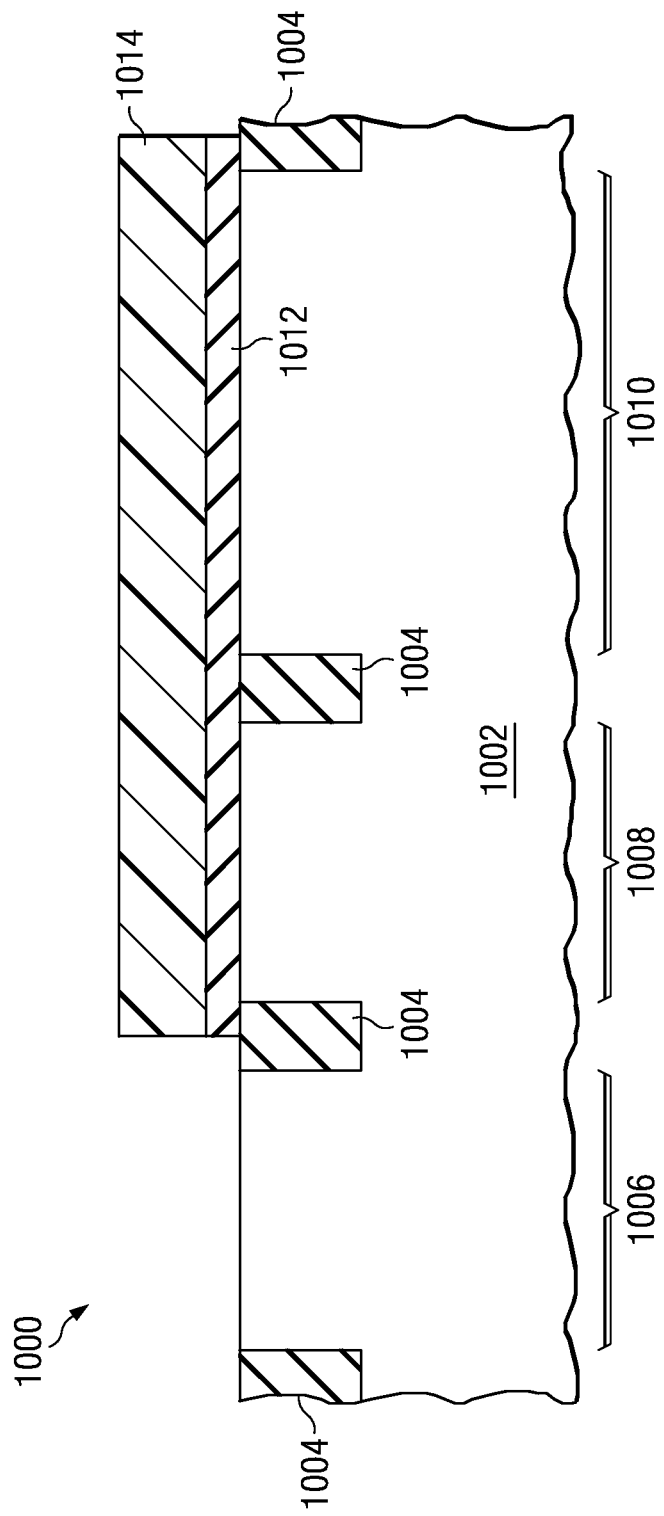

Referring to FIG. 1B, the dummy oxide layer 1012 is removed in an area exposed by the NMOS ion implantation photoresist pattern 1014. The dummy oxide layer 1012 under the NMOS ion implantation photoresist pattern 1014 is not removed. In particular, the dummy oxide layer 1012 in the DEMOS/LDMOS transistor 1010 area is not removed. The exposed portion of the dummy oxide layer 1012 may be removed for example using a wet etch containing dilute or buffered hydrofluoric (HF) acid solution, or by a plasma etch containing fluorine ions. The NMOS ion implantation photoresist pattern 1014 is removed subsequent to removing the dummy oxide layer 1012 in an area exposed by the NMOS ion implantation photoresist pattern 1014. The NMOS ion implantation photoresist pattern 1014 may be removed by exposing the integrated circuit 1000 to an oxygen containing plasma, followed by a wet cleanup to remove any organic residue from the top surface of the dummy oxide layer 1012.

Figure 1C:
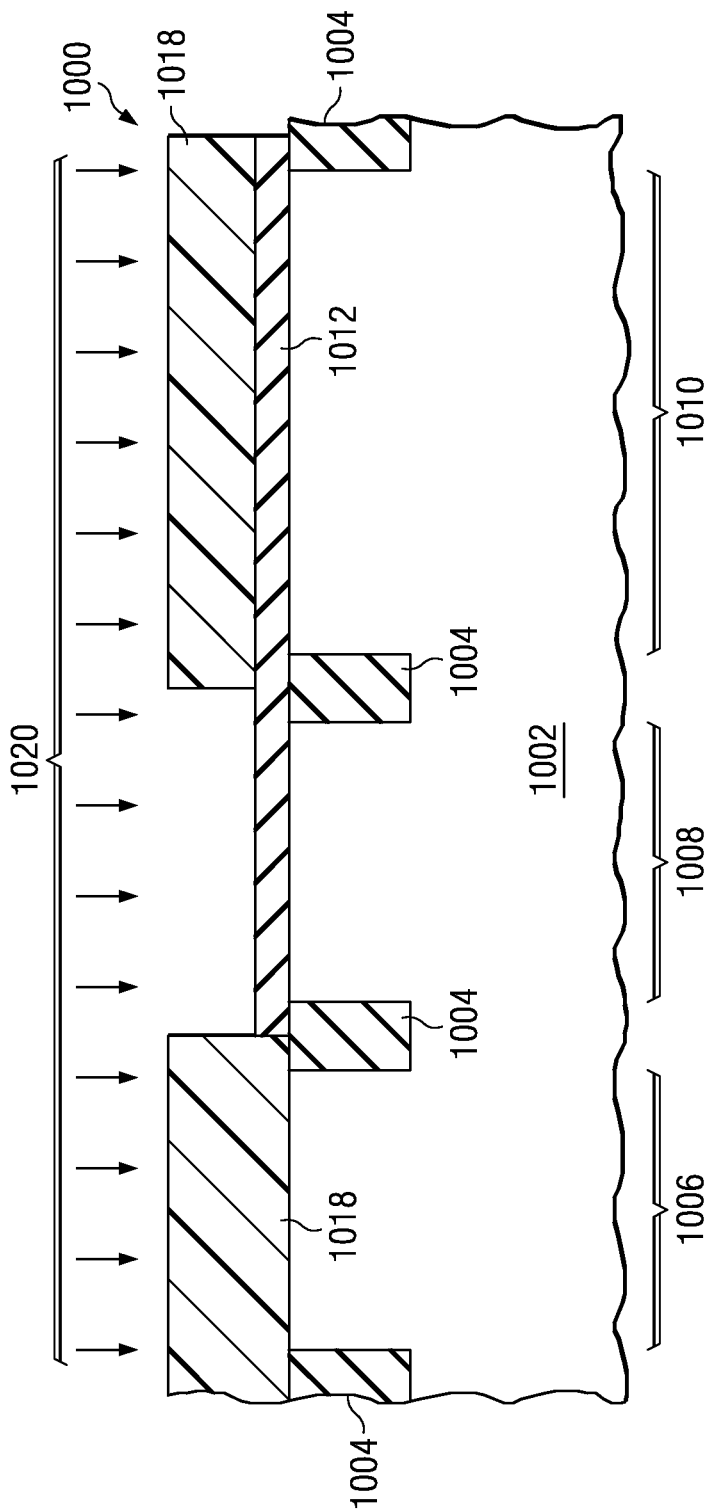

Referring to FIG. 1C, a PMOS ion implantation photoresist pattern 1018 is formed on a top surface of the dummy oxide layer 1012 and possibly on the substrate 1002 so as to cover the DEMOS/LDMOS transistor 1010 area and expose the symmetric PMOS transistor 1008 area. The PMOS ion implantation photoresist pattern 1018 may also cover the symmetric NMOS transistor 1006 area. A PMOS ion implantation process 1020 is performed while the PMOS ion implantation photoresist pattern 1018 is in place so that PMOS dopants are implanted into the symmetric PMOS transistor 1008 area.

Figure 1D:
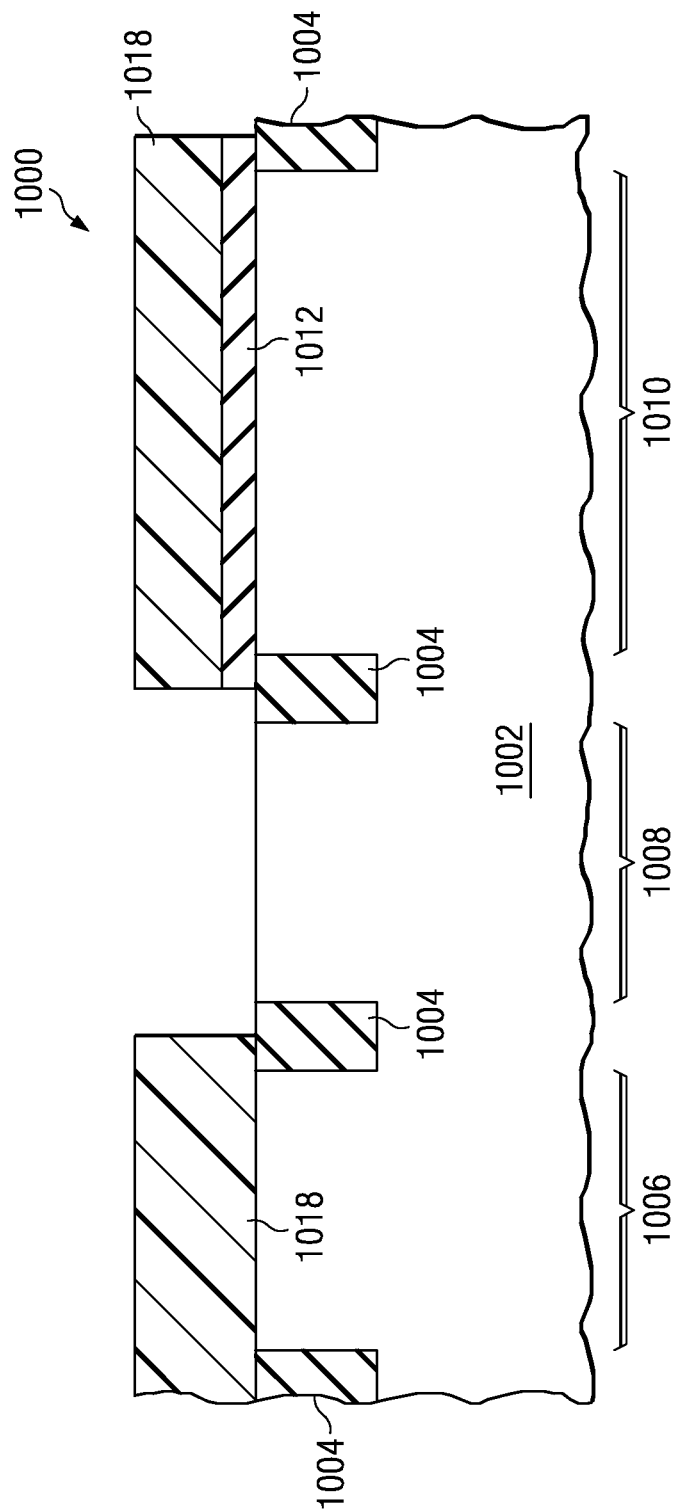

Referring to FIG. 1D, the dummy oxide layer 1012 is removed in an area exposed by the PMOS ion implantation photoresist pattern 1018. The dummy oxide layer 1012 under the PMOS ion implantation photoresist pattern 1018 is not removed. In particular, the dummy oxide layer 1012 in the DEMOS/LDMOS transistor 1010 area is not removed. The exposed portion of the dummy oxide layer 1012 may be removed as described in reference to FIG. 1B. The PMOS ion implantation photoresist pattern 1018 is removed subsequent to removing the dummy oxide layer 1012 in an area exposed by the PMOS ion implantation photoresist pattern 1018. The PMOS ion implantation photoresist pattern 1018 may be removed as described in reference to FIG. 1B.

Figure 1E:
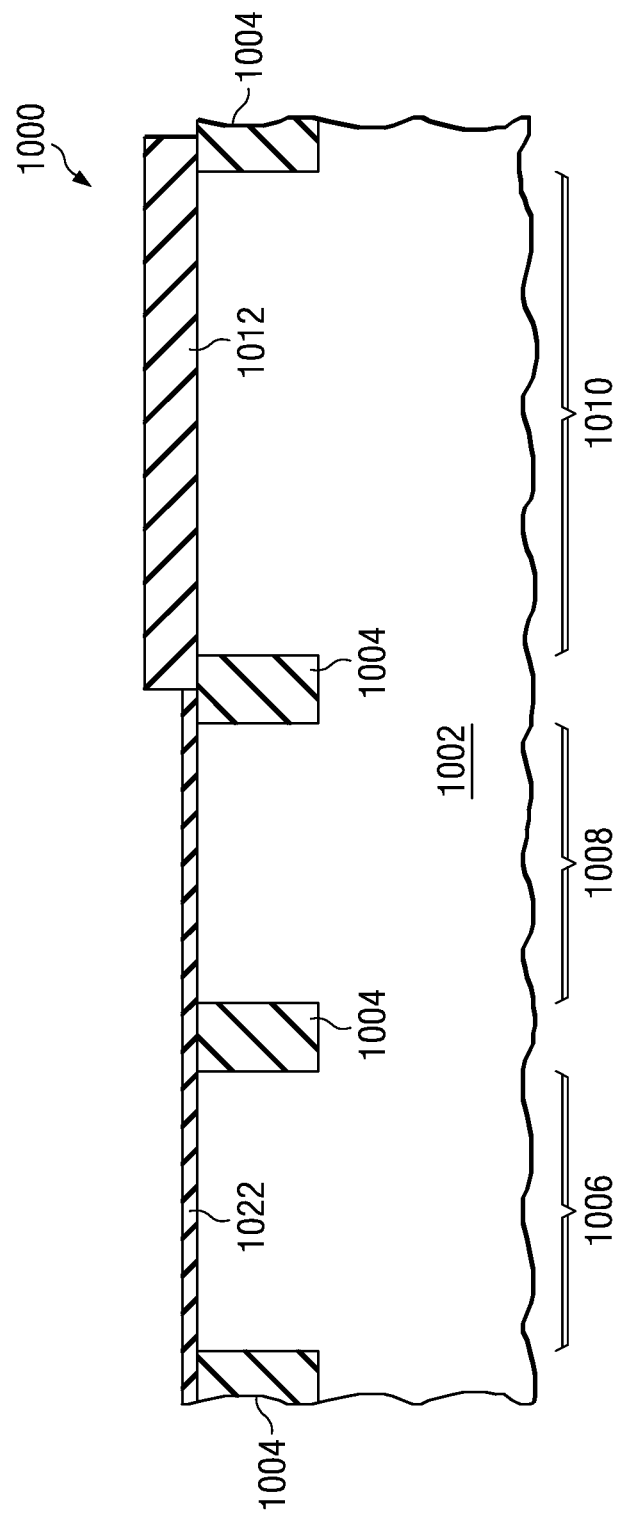

Referring to FIG. 1E, a lower voltage MOS gate dielectric layer 1022 is formed on exposed portions of the substrate 1002, including the symmetric NMOS transistor 1006 area and symmetric PMOS transistor 1008 area. A thickness of the lower voltage MOS gate dielectric layer 1022 less than a thickness of the dummy oxide layer 1012 in the DEMOS/LDMOS transistor 1010 area after the lower voltage MOS gate dielectric layer 1022 is formed. The thickness of the lower voltage MOS gate dielectric layer 1022 is appropriate for the symmetric NMOS transistor 1006 and symmetric PMOS transistor 1008. In one realization of the instant embodiment, the thickness of the lower voltage MOS gate dielectric layer 1022 may be less than 2.5 nanometers. In another realization, the thickness of the lower voltage MOS gate dielectric layer 1022 may be between 2.5 and 4 nanometers. The lower voltage MOS gate dielectric layer 1022 may be formed by growing a thermal oxide layer, for example in a dry oxygen ambient at a temperature above 900 C. In one realization of the instant embodiment, the thickness of the dummy oxide layer 1012 in the DEMOS/LDMOS transistor 1010 area may be increased by at least 1 nanometer during formation of the lower voltage MOS gate dielectric layer 1022. Work performed in conjunction with this description has shown that forming the lower voltage MOS gate dielectric layer 1022 in a dry oxygen ambient at a temperature above 900 C such that the thickness of the dummy oxide layer 1012 is increased by at least 1 nanometer provides breakdown voltages in the dummy oxide layer 1012 above $2 \times 10^6$ volts/cm.

Figure 1F:
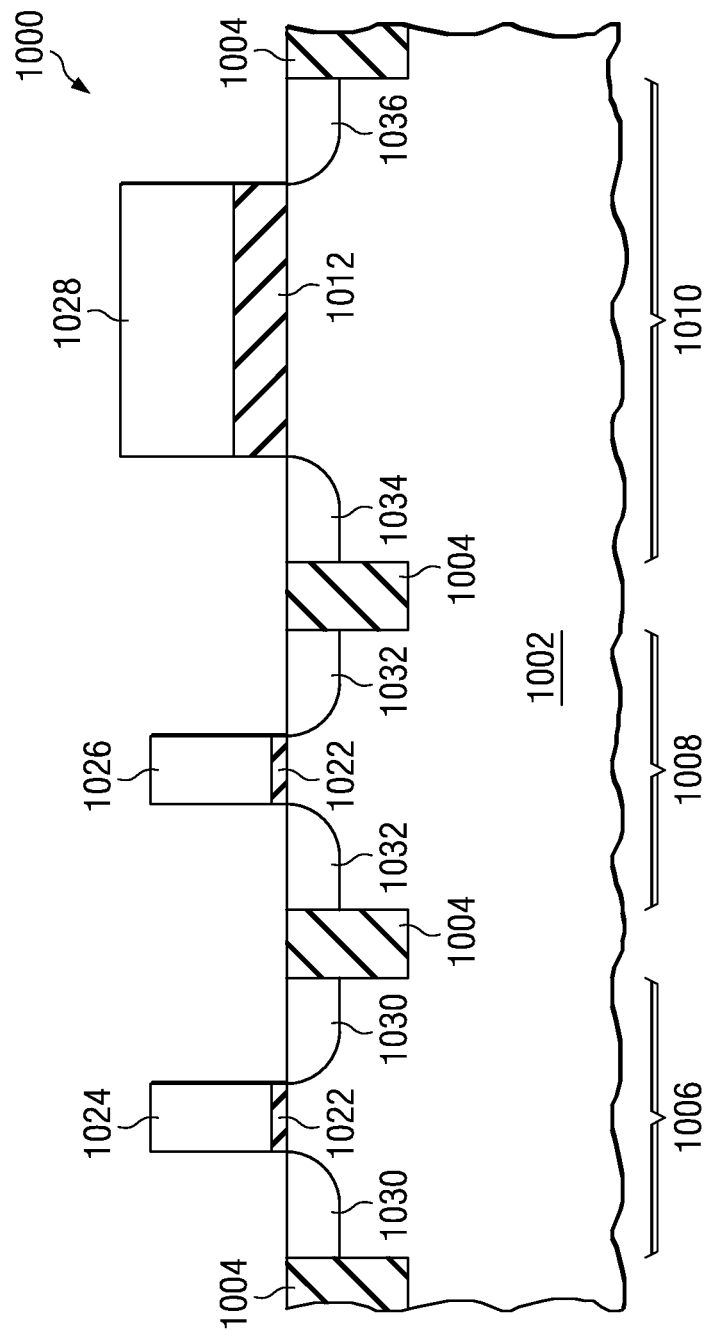

Referring to FIG. 1F, a symmetric NMOS gate 1024 is formed on the lower voltage MOS gate dielectric layer 1022 in the symmetric NMOS transistor 1006 area. A symmetric PMOS gate 1026 is formed on the lower voltage MOS gate dielectric layer 1022 in the symmetric PMOS transistor 1008 area. A DEMOS/LDMOS gate 1028 is formed on the dummy oxide layer 1012 in the DEMOS/LDMOS transistor 1010 area. Symmetric NMOS source and drain regions 1030 are formed in the substrate 1002 in the symmetric NMOS transistor 1006 area adjacent to the symmetric NMOS gate 1024. Symmetric PMOS source and drain regions 1032 are formed in the substrate 1002 in the symmetric PMOS transistor 1008 area adjacent to the symmetric PMOS gate 1026. A DEMOS/LDMOS source region 1034 is formed in the substrate 1002 in the DEMOS/LDMOS transistor 1010 area adjacent to and on one side of the DEMOS/LDMOS gate 1028. A DEMOS/LDMOS drain region 1036 is formed in the substrate 1002 in the DEMOS/LDMOS transistor 1010 area adjacent to the DEMOS/LDMOS gate 1028 opposite the DEMOS/LDMOS source region 1034.

Forming the DEMOS/LDMOS transistor 1010 using the dummy oxide layer 1012 may advantageously reduce fabrication cost and complexity of the integrated circuit 1000.

Figure 2A:
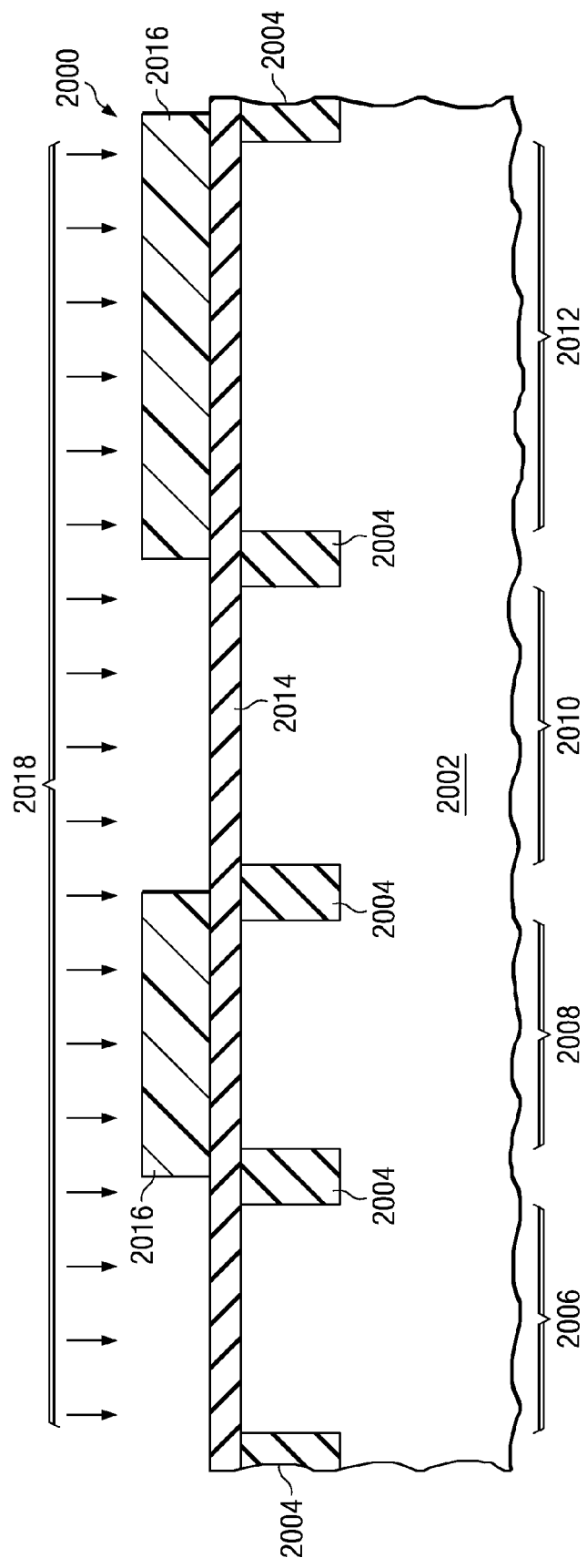
FIG. 2A through FIG. 2H are cross-sections of an integrated circuit formed according to a second embodiment, depicted in successive stages of fabrication.

FIG. 2A through FIG. 2H are cross-sections of an integrated circuit formed according to a second embodiment, depicted in successive stages of fabrication. Referring to FIG. 2A, the integrated circuit is formed in and on a substrate 2002 as described in reference to FIG. 1A. Elements of field oxide 2004 may be formed at a top surface of the substrate 2002, as described in reference to FIG. 1A. The field oxide elements 2004 may isolate areas defined for a lower voltage symmetric NMOS transistor 2006, a lower voltage symmetric PMOS transistor 2008, an intermediate voltage symmetric MOS transistor 2010 and a DEMOS/LDMOS transistor 2012. A dummy oxide layer 2014 is formed on a top surface of the substrate 2002, as described in reference to FIG. 1A, in particular in the lower voltage symmetric NMOS transistor 2006 area, the lower voltage symmetric PMOS transistor 2008 area, the intermediate voltage symmetric MOS transistor 2010 area, and the DEMOS/LDMOS transistor 2012 area. In one realization of the instant embodiment, a thickness of the dummy oxide layer 2014 may be greater than 10 nanometers. An NMOS ion implantation photoresist pattern 2016 is formed on a top surface of the dummy oxide layer 2014 so as to cover the DEMOS/LDMOS transistor 2012 area and expose the lower voltage symmetric NMOS transistor 2006 area. The NMOS ion implantation photoresist pattern 2016 may also cover the lower voltage symmetric PMOS transistor 2008 area. In one realization of the instant embodiment, the NMOS ion implantation photoresist pattern 2016 may expose the intermediate voltage symmetric MOS transistor 2010 area as depicted in FIG. 2A. In another realization, the NMOS ion implantation photoresist pattern 2016 may cover the intermediate voltage symmetric MOS transistor 2010 area. An NMOS ion implantation process 2018 is performed while the NMOS ion implantation photoresist pattern 2016 is in place so that NMOS dopants are implanted into the lower voltage symmetric NMOS transistor 2006 area.

Figure 2B:
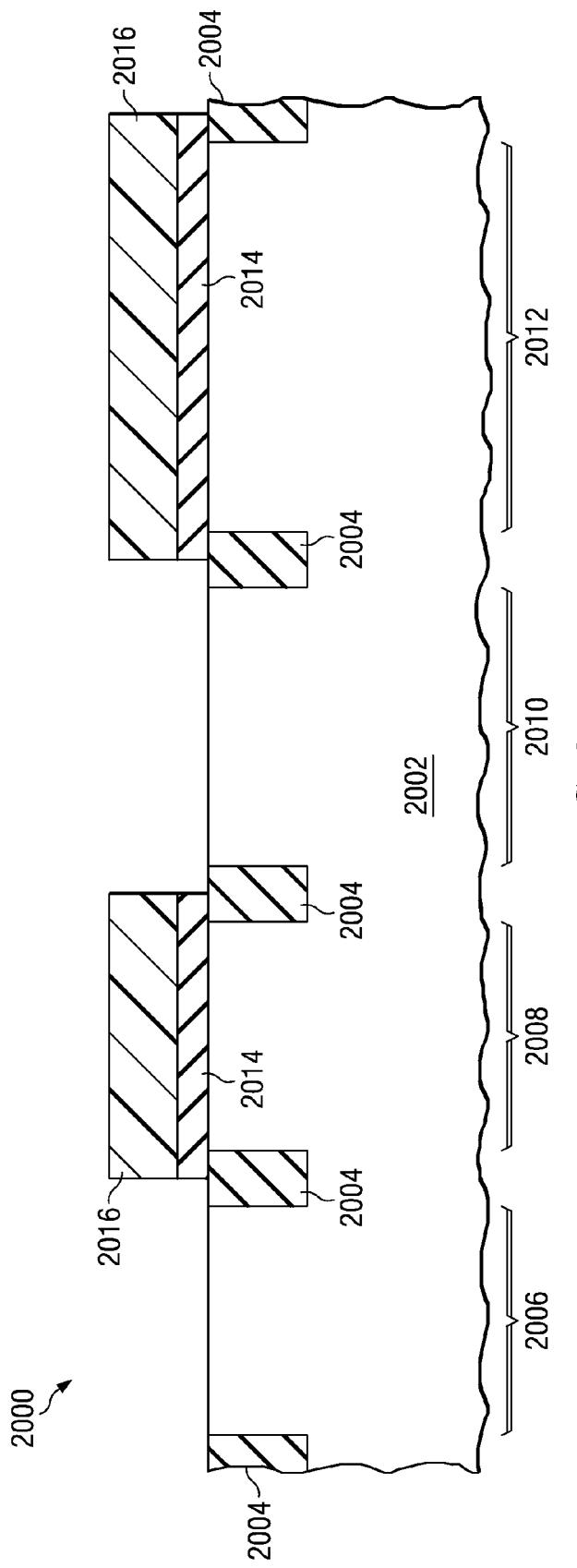

Referring to FIG. 2B, the dummy oxide layer 2014 is removed in areas exposed by the NMOS ion implantation photoresist pattern 2016. The dummy oxide layer 2014 under the NMOS ion implantation photoresist pattern 2016 is not removed. In particular, the dummy oxide layer 2014 in the DEMOS/LDMOS transistor 2012 area is not removed. The exposed portion of the dummy oxide layer 2014 may be removed as described in reference to FIG. 1B. The NMOS ion implantation photoresist pattern 2016 is removed subsequent to removing the dummy oxide layer 2014 in an area exposed by the NMOS ion implantation photoresist pattern 2016. The NMOS ion implantation photoresist pattern 2016 may be removed as described in reference to FIG. 1B.

Figure 2C:
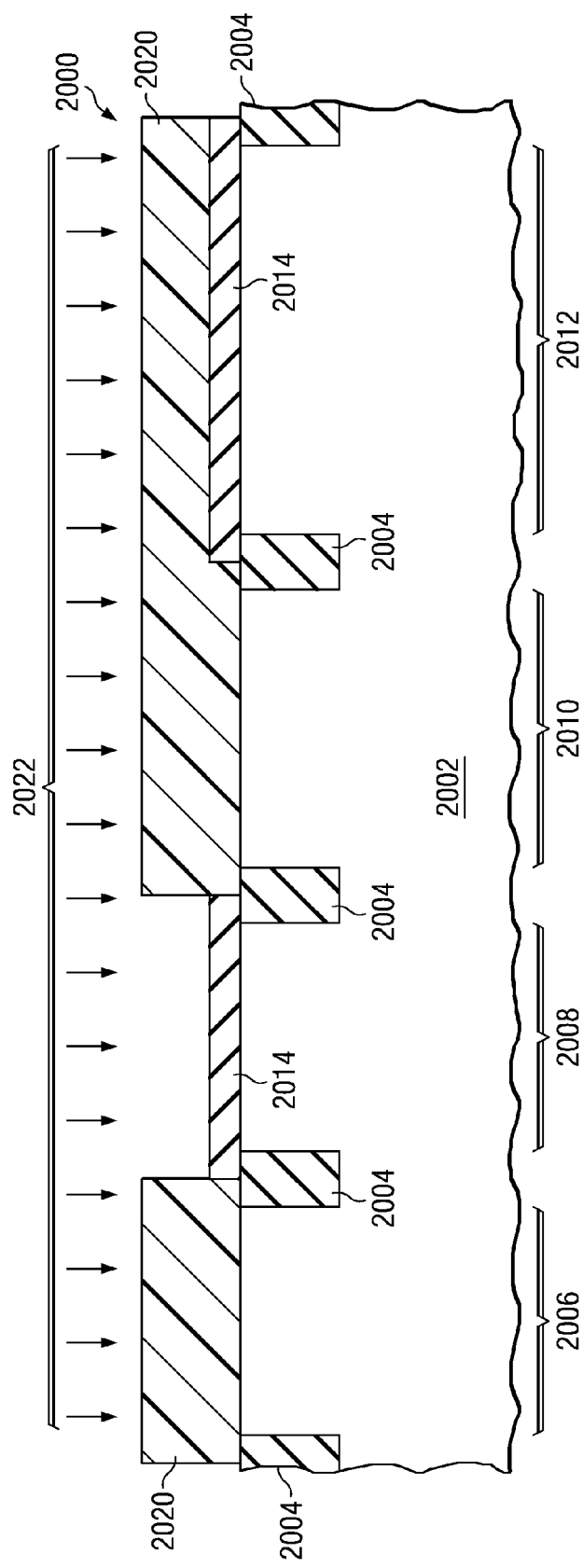

Referring to FIG. 2C, a PMOS ion implantation photoresist pattern 2020 is formed on a top surface of the dummy oxide layer 2014 and possibly on the substrate 2002 so as to cover the DEMOS/LDMOS transistor 2012 area and expose the lower voltage symmetric PMOS transistor 2008 area. The PMOS ion implantation photoresist pattern 2020 may also cover the lower voltage symmetric NMOS transistor 2006 area. In one realization of the instant embodiment, the PMOS ion implantation photoresist pattern 2020 may cover the intermediate voltage symmetric MOS transistor 2010 area as depicted in FIG. 2C. In another realization, the PMOS ion implantation photoresist pattern 2020 may expose the intermediate voltage symmetric MOS transistor 2010 area. A PMOS ion implantation process 2022 is performed while the PMOS ion implantation photoresist pattern 2020 is in place so that PMOS dopants are implanted into the lower voltage symmetric PMOS transistor 2008 area.

Figure 2D:
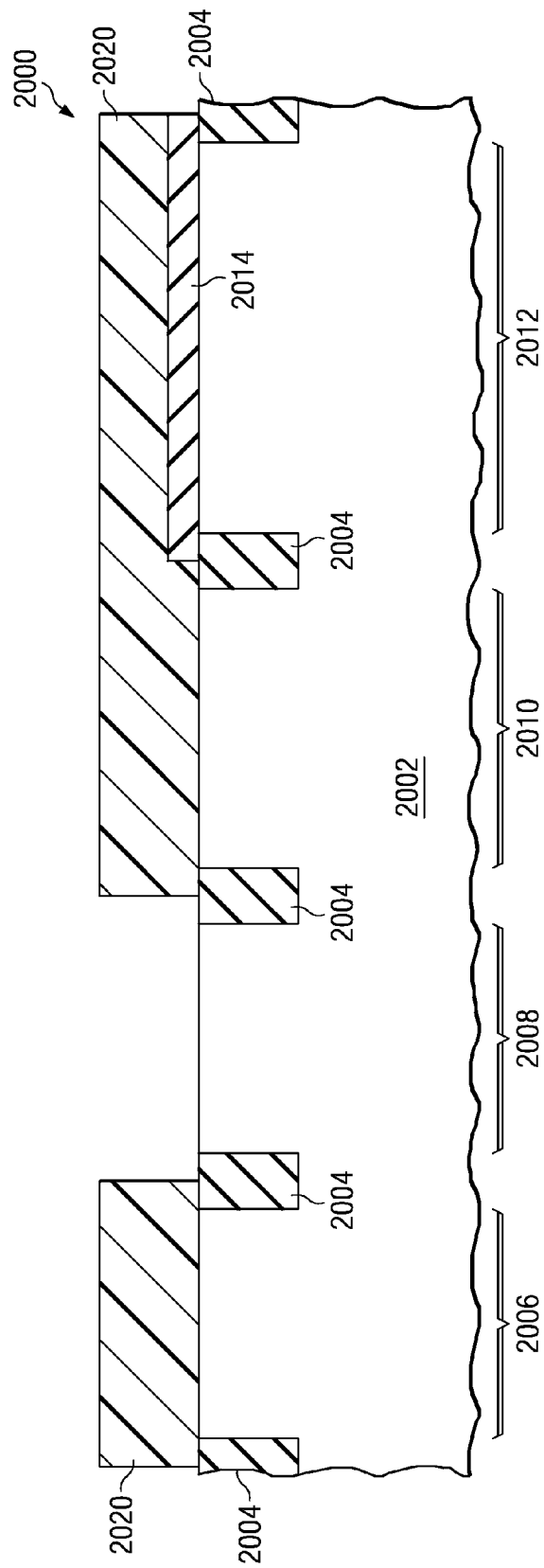

Referring to FIG. 2D, the dummy oxide layer 2014 is removed in an area or areas exposed by the PMOS ion implantation photoresist pattern 2020. The dummy oxide layer 2014 under the PMOS ion implantation photoresist pattern 2020 is not removed. In particular, the dummy oxide layer 2014 in the DEMOS/LDMOS transistor 2012 area is not removed. The exposed portion of the dummy oxide layer 2014 may be removed as described in reference to FIG. 1B. The PMOS ion implantation photoresist pattern 2020 is removed subsequent to removing the dummy oxide layer 2014 in an area exposed by the PMOS ion implantation photoresist pattern 2020. The PMOS ion implantation photoresist pattern 2020 may be removed as described in reference to FIG. 1B.

Figure 2E:
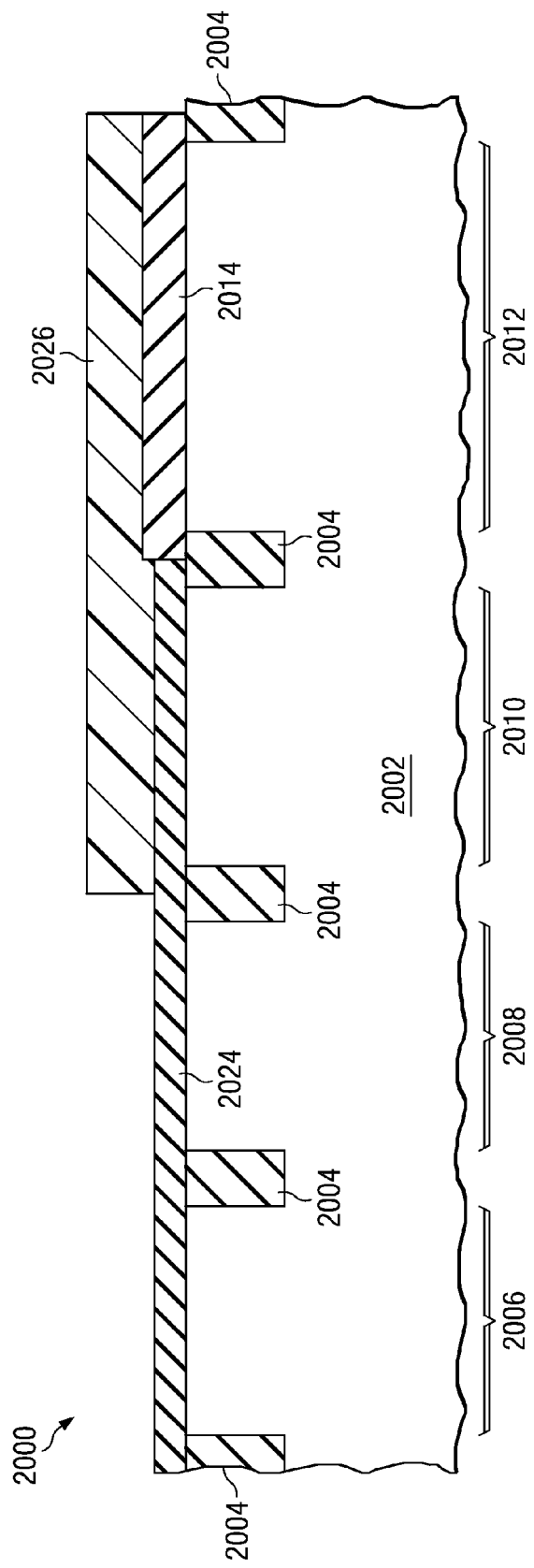

Referring to FIG. 2E, an intermediate voltage MOS gate dielectric layer 2024 is formed on exposed portions of the substrate 2002, including the lower voltage symmetric NMOS transistor 2006 area, the lower voltage symmetric PMOS transistor 2008 area, and the intermediate voltage symmetric transistor 2010 area. The dummy oxide layer 2014 over the intermediate voltage symmetric transistor 2010 area is removed prior to formation of the intermediate voltage MOS gate dielectric layer 2024. The dummy oxide layer 2014 over the intermediate voltage symmetric transistor 2010 area may be exposed by the NMOS ion implantation photoresist pattern 2016 and removed as described in reference to FIG. 2B, or may be exposed by the PMOS ion implantation photoresist pattern 2020 and removed while the PMOS ion implantation photoresist pattern 2020 is in place, or may be removed during another operation. The intermediate voltage MOS gate dielectric layer 2024 has a thickness appropriate for the intermediate voltage symmetric transistor 2010. In one realization of the instant embodiment, the thickness of the intermediate voltage MOS gate dielectric layer 2024 may be between 3 and 9 nanometers. In one realization of the instant embodiment, the intermediate voltage MOS gate dielectric layer 2024 may be formed by thermal oxidation, for example in a dry oxygen ambient at a temperature above 900 C. In one realization of the instant embodiment, the thickness of the dummy oxide layer 2014 in the DEMOS/LDMOS transistor 2012 area may be increased by at least 1 nanometer. In an alternate realization, the intermediate voltage MOS gate dielectric layer 2024 may be formed by a deposition process, such as CVD, PECVD, LPCVD, APCVD, HDP, or other deposition process.

An intermediate voltage MOS gate dielectric removal photoresist pattern 2026 is formed on the intermediate voltage MOS gate dielectric layer 2024 in the intermediate voltage symmetric transistor 2010 area and on the dummy oxide layer 2014 in the DEMOS/LDMOS transistor 2012 area. The lower voltage symmetric NMOS transistor 2006 area and the lower voltage symmetric PMOS transistor 2008 area are exposed by the intermediate voltage MOS gate dielectric removal photoresist pattern 2026.

Figure 2F:
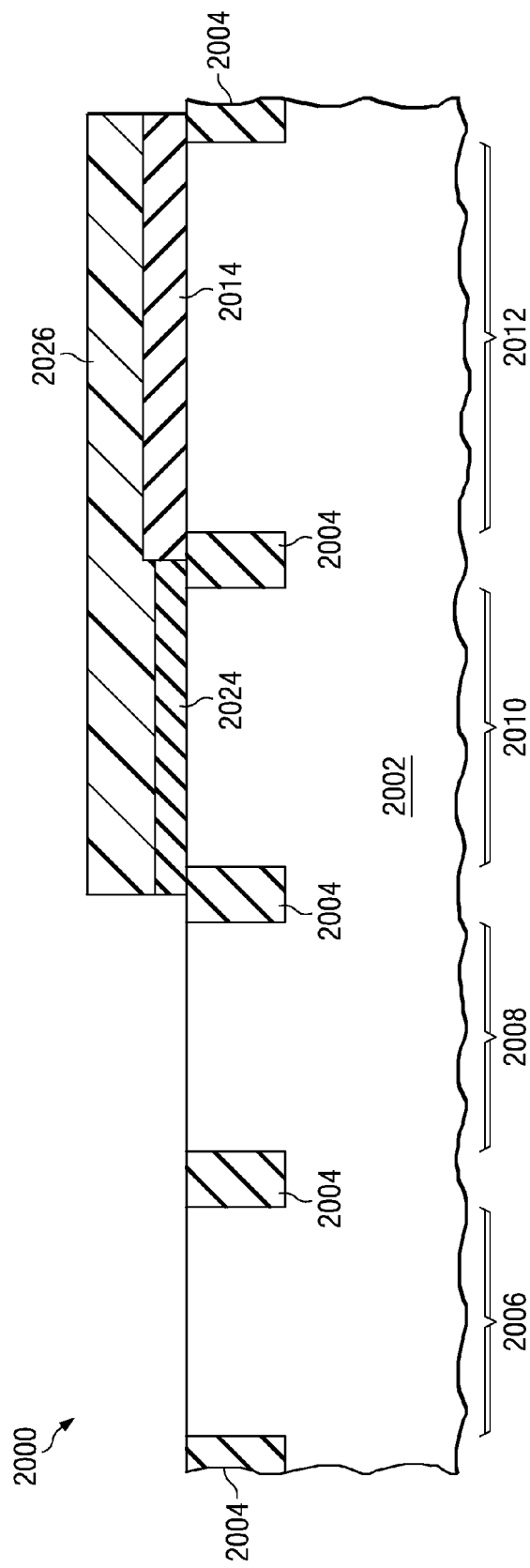

Referring to FIG. 2F, the intermediate voltage MOS gate dielectric layer 2024 is removed from areas exposed by the intermediate voltage MOS gate dielectric removal photoresist pattern 2026, including the lower voltage symmetric NMOS transistor 2006 area and the lower voltage symmetric PMOS transistor 2008 area. The intermediate voltage MOS gate dielectric layer 2024 in the intermediate voltage symmetric transistor 2010 area and the dummy oxide layer 2014 in the DEMOS/LDMOS transistor 2012 area are not removed. The intermediate voltage MOS gate dielectric removal photoresist pattern 2026 is removed subsequent to removing the intermediate voltage MOS gate dielectric layer 2024 in an area exposed by the intermediate voltage MOS gate dielectric removal photoresist pattern 2026. The intermediate voltage MOS gate dielectric removal photoresist pattern 2026 may be removed as described in reference to FIG. 1B.

Figure 2G:
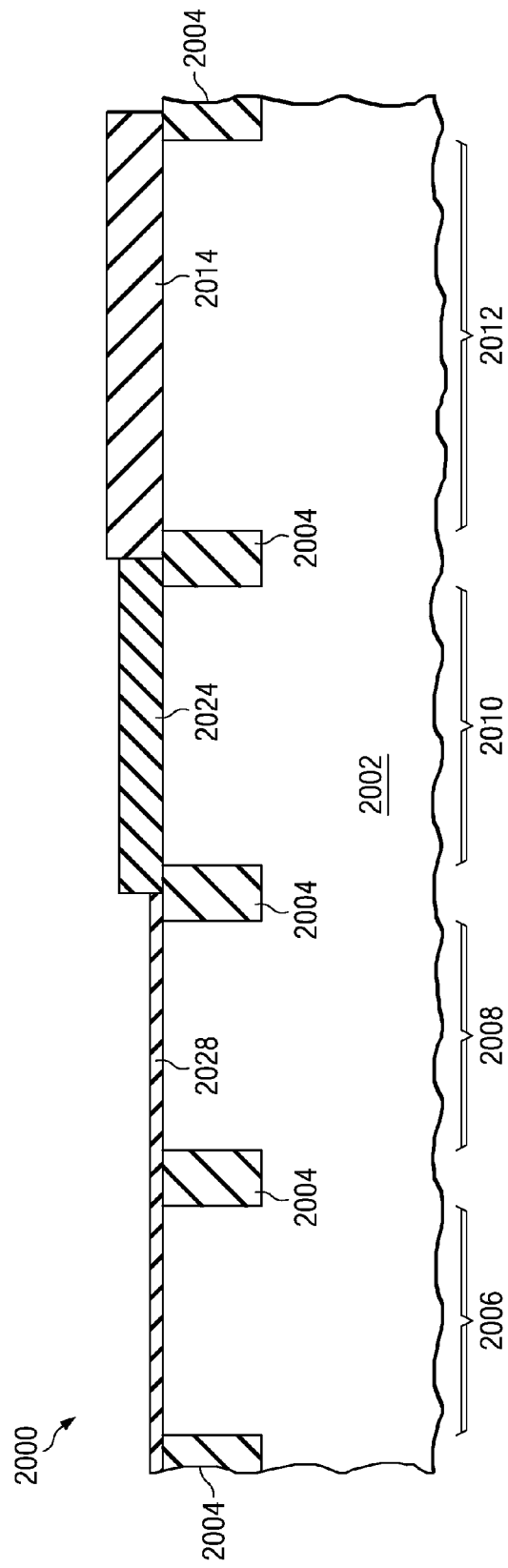

Referring to FIG. 2G, a lower voltage MOS gate dielectric layer 2028 is formed on exposed portions of the substrate 2002, including the lower voltage symmetric NMOS transistor 2006 area and the lower voltage symmetric PMOS transistor 2008 area. The lower voltage MOS gate dielectric layer 2028 has a thickness appropriate for the lower voltage symmetric NMOS transistor 2006 and lower voltage symmetric PMOS transistor 2008. In one realization of the instant embodiment, the thickness of the lower voltage MOS gate dielectric layer 2028 may be less than 2.5 nanometers. The lower voltage MOS gate dielectric layer 2028 may be formed by thermal oxidation, for example in a dry oxygen ambient at a temperature above 900 C. In one realization of the instant embodiment, the thickness of the dummy oxide layer 2014 in the DEMOS/LDMOS transistor 2012 area may be increased by at least 1 nanometer.

Figure 2H:
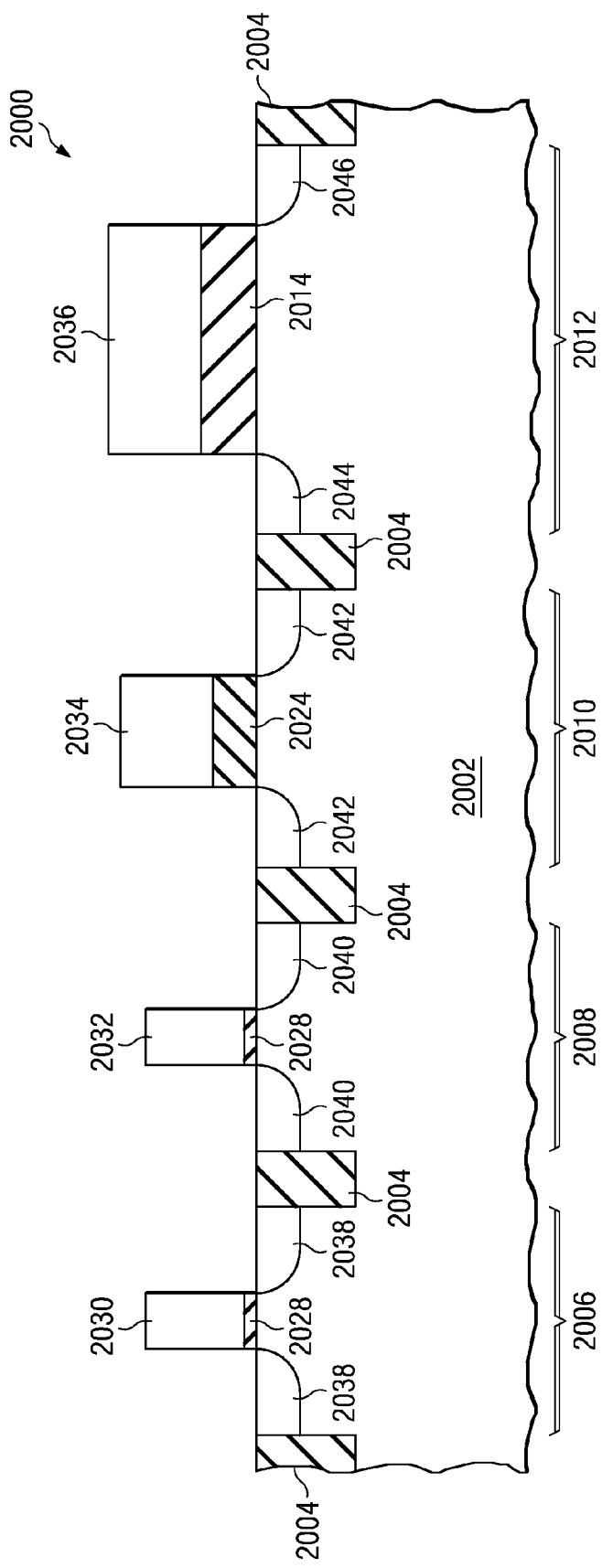

Referring to FIG. 2H, a lower voltage symmetric NMOS gate 2030 is formed on the lower voltage MOS gate dielectric layer 2028 in the lower voltage symmetric NMOS transistor 2006 area. A lower voltage symmetric PMOS gate 2032 is formed on the lower voltage MOS gate dielectric layer 2028 in the lower voltage symmetric PMOS transistor 2008 area. An intermediate voltage symmetric MOS gate 2034 is formed on the intermediate voltage MOS gate dielectric layer 2024 in the intermediate voltage symmetric transistor 2010 area. A DEMOS/LDMOS gate 2036 is formed on the dummy oxide layer 2014 in the DEMOS/LDMOS transistor 2012 area. Lower voltage symmetric NMOS source and drain regions 2038 are formed in the substrate 2002 in the lower voltage symmetric NMOS transistor 2006 area adjacent to the lower voltage symmetric NMOS gate 2030. Lower voltage symmetric PMOS source and drain regions 2040 are formed in the substrate 2002 in the lower voltage symmetric PMOS transistor 2008 area adjacent to the lower voltage symmetric PMOS gate 2032. Intermediate voltage symmetric MOS source and drain regions 2042 are formed in the substrate 2002 in the intermediate voltage symmetric transistor 2010 area adjacent to the lower voltage symmetric PMOS gate 2032. A DEMOS/LDMOS source region 2044 is formed in the substrate 2002 in the DEMOS/LDMOS transistor 2012 area adjacent to and on one side of the DEMOS/LDMOS gate 2036. A DEMOS/LDMOS drain region 2046 is formed in the substrate 2002 in the DEMOS/LDMOS transistor 2012 area adjacent to the DEMOS/LDMOS gate 2036 opposite the DEMOS/LDMOS source region 2044.

Forming the DEMOS/LDMOS transistor 2012 using the dummy oxide layer 2014 may advantageously reduce fabrication cost and complexity of the integrated circuit 2000.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. A process of forming an integrated circuit, comprising steps:
   providing a substrate;
   forming a dummy oxide layer on a top surface of said substrate, so that said dummy oxide layer covers a symmetric metal oxide semiconductor (MOS) transistor area and a drain extended metal oxide semiconductor (DEMOS)/laterally diffused metal oxide semiconductor (LDMOS) transistor area;
   forming a MOS ion implantation photoresist pattern on said dummy oxide layer, so that said MOS ion implantation photoresist pattern covers said DEMOS/LDMOS transistor area and exposes said symmetric MOS transistor area;
   performing an MOS ion implantation process so that MOS dopants are implanted into said symmetric MOS transistor area;
   removing said dummy oxide layer in said symmetric MOS transistor area in a manner such that said dummy oxide layer under said MOS ion implantation photoresist pattern in said DEMOS/LDMOS transistor area is not removed;
   removing said MOS ion implantation photoresist pattern;
   forming a lower voltage MOS gate dielectric layer on exposed portions of said substrate, so that said symmetric MOS transistor area is covered by said lower voltage MOS gate dielectric layer, and so that a thickness of said lower voltage MOS gate dielectric layer is less than a thickness of said dummy oxide layer in said DEMOS/LDMOS transistor area after said lower voltage MOS gate dielectric layer is formed;
   forming a symmetric MOS gate on said lower voltage MOS gate dielectric layer in said symmetric MOS transistor area;
   forming a DEMOS/LDMOS gate on said dummy oxide layer in said DEMOS/LDMOS transistor area;
   forming symmetric MOS source and drain regions in said substrate in said symmetric NMOS transistor area adjacent to said symmetric MOS gate;
   forming a DEMOS/LDMOS source region in said substrate in said DEMOS/LDMOS transistor area adjacent to and on one side of said DEMOS/LDMOS gate; and
   forming a DEMOS/LDMOS drain region in said substrate in said DEMOS/LDMOS transistor area adjacent to said DEMOS/LDMOS gate opposite from said DEMOS/LDMOS source region.

2. The process of claim 1, in which said step of forming said dummy oxide layer is performed by growing a thermal oxide layer so that a portion of a top layer of said substrate is consumed.

3. The process of claim 1, in which said step of forming said dummy oxide layer is performed so that said dummy oxide layer is more than 5 nanometers thick.

4. The process of claim 1, in which said step of forming said lower voltage MOS gate dielectric layer is performed by growing a thermal oxide layer.

5. The process of claim 4, in which a thickness of said dummy oxide layer in said DEMOS/LDMOS transistor area is increased by at least 1 nanometer during said step of forming said lower voltage MOS gate dielectric layer.

6. The process of claim 1, in which said thickness of said lower voltage MOS gate dielectric layer is less than 2.5 nanometers.

7. The process of claim 1, in which said thickness of said lower voltage MOS gate dielectric layer is between 2.5 nanometers and 4 nanometers.

8. The process of claim 1, in which:
   said symmetric MOS transistor area is an n-channel metal oxide semiconductor (NMOS) transistor area;
   said dummy oxide layer covers a symmetric p-channel metal oxide semiconductor (PMOS) transistor area;
   said MOS dopants are NMOS dopants;
   said lower voltage MOS gate dielectric layer covers said PMOS transistor area; and
   said symmetric MOS source and drain regions are symmetric NMOS source and drain regions.

9. The process of claim 8, further including the steps of:
   forming a PMOS ion implantation photoresist pattern on said dummy oxide layer and on said substrate, so that said PMOS ion implantation photoresist pattern covers said DEMOS/LDMOS transistor area and exposes said symmetric PMOS transistor area;

performing a PMOS ion implantation process so that PMOS dopants are implanted into said symmetric PMOS transistor area;

removing said dummy oxide layer in said symmetric PMOS transistor area in a manner such that said dummy oxide layer under said PMOS ion implantation photoresist pattern in said DEMOS/LDMOS transistor area is not removed;

removing said PMOS ion implantation photoresist pattern;

forming a symmetric PMOS gate on said lower voltage gate dielectric layer in said symmetric PMOS transistor area; and forming symmetric PMOS source and drain regions in said substrate in said symmetric PMOS transistor area adjacent to said symmetric PMOS gate.

10. A process of forming an integrated circuit, comprising steps:

providing a substrate;

forming a dummy oxide layer on a top surface of said substrate, so that said dummy oxide layer covers a lower voltage symmetric MOS transistor area, an intermediate voltage symmetric MOS transistor area, and a DEMOS/LDMOS transistor area;

forming a lower voltage MOS ion implantation photoresist pattern on said dummy oxide layer, so that said lower voltage MOS ion implantation photoresist pattern covers said DEMOS/LDMOS transistor area and exposes said lower voltage symmetric MOS transistor area;

performing a lower voltage MOS ion implantation process so that lower voltage MOS dopants are implanted into said lower voltage symmetric MOS transistor area;

removing said dummy oxide layer in said lower voltage symmetric MOS transistor area in a manner such that said dummy oxide layer under said lower voltage MOS ion implantation photoresist pattern in said DEMOS/LDMOS transistor area is not removed;

removing said lower voltage MOS ion implantation photoresist pattern;

removing said dummy oxide layer in said intermediate voltage symmetric MOS transistor area;

forming an intermediate voltage MOS gate dielectric layer on exposed portions of said substrate, so that said lower voltage symmetric MOS transistor area and said intermediate voltage symmetric MOS transistor area are covered by said intermediate voltage MOS gate dielectric layer;

forming an intermediate voltage MOS gate dielectric removal photoresist pattern on said intermediate voltage MOS gate dielectric layer in said intermediate voltage symmetric transistor area and on said dummy oxide layer in said DEMOS/LDMOS transistor area, such that said lower voltage symmetric MOS transistor area is exposed by said intermediate voltage MOS gate dielectric removal photoresist pattern;

removing said intermediate voltage MOS gate dielectric layer in said lower voltage symmetric MOS transistor area;

removing said intermediate voltage MOS gate dielectric removal photoresist pattern;

forming a lower voltage MOS gate dielectric layer on exposed portions of said substrate, so that said lower voltage symmetric MOS transistor area is covered by said lower voltage MOS gate dielectric layer, and so that a thickness of said lower voltage MOS gate dielectric layer is less than a thickness of said dummy oxide layer in said DEMOS/LDMOS transistor area after said lower voltage MOS gate dielectric layer is formed;

forming a lower voltage symmetric MOS gate on said lower voltage MOS gate dielectric layer in said lower voltage symmetric MOS transistor area;

forming an intermediate voltage symmetric MOS gate on said intermediate voltage MOS gate dielectric layer in said intermediate voltage symmetric transistor area;

forming a DEMOS/LDMOS gate on said dummy oxide layer in said DEMOS/LDMOS transistor area;

forming lower voltage symmetric MOS source and drain regions in said substrate in said lower voltage symmetric MOS transistor area adjacent to said lower voltage symmetric MOS gate;

forming intermediate voltage symmetric MOS source and drain regions in said substrate in said intermediate voltage symmetric transistor area adjacent to said intermediate voltage symmetric MOS gate;

forming a DEMOS/LDMOS source region in said substrate in said DEMOS/LDMOS transistor area adjacent to and on one side of said DEMOS/LDMOS gate; and forming a DEMOS/LDMOS drain region in said substrate in said DEMOS/LDMOS transistor area adjacent to said DEMOS/LDMOS gate opposite from said DEMOS/LDMOS source region.

11. The process of claim 10, in which said step of forming said dummy oxide layer is performed by growing a thermal oxide layer so that a portion of a top layer of said substrate is consumed.

12. The process of claim 10, in which said step of forming said dummy oxide layer is performed so that said dummy oxide layer is more than 5 nanometers thick.

13. The process of claim 10, in which said step of forming said lower voltage MOS gate dielectric layer is performed by growing a thermal oxide layer.

14. The process of claim 13, in which a thickness of said dummy oxide layer in said DEMOS/LDMOS transistor area is increased by at least 1 nanometer during said step of forming said lower voltage MOS gate dielectric layer.

15. The process of claim 10, in which said thickness of said lower voltage MOS gate dielectric layer is less than 2.5 nanometers.

16. The process of claim 10, in which a thickness of said intermediate voltage MOS gate dielectric layer is between 3 nanometers and 9 nanometers.

17. The process of claim 10, in which said step of forming said intermediate voltage MOS gate dielectric layer is performed by growing a thermal oxide layer.

18. The process of claim 10, in which said step of forming said intermediate voltage MOS gate dielectric layer is performed by depositing a silicon oxide layer.

19. The process of claim 10, in which:

said lower voltage symmetric MOS transistor area is a lower voltage NMOS transistor area;

said intermediate voltage symmetric MOS transistor area is an intermediate voltage NMOS transistor area;

said dummy oxide layer covers a symmetric p-channel metal oxide semiconductor (PMOS) transistor area;

said lower voltage MOS dopants are NMOS dopants;

said lower voltage MOS gate dielectric layer covers said PMOS transistor area;

said lower voltage symmetric MOS source and drain regions are lower voltage symmetric NMOS source and drain regions, and said intermediate symmetric MOS source and drain regions are intermediate symmetric NMOS source and drain regions.

20. The process of claim 19, further including the steps of:

forming a PMOS ion implantation photoresist pattern on said dummy oxide layer and on said substrate, so that said PMOS ion implantation photoresist pattern covers said DEMOS/LDMOS transistor area and exposes said symmetric PMOS transistor area;

performing a PMOS ion implantation process so that PMOS dopants are implanted into said symmetric PMOS transistor area;

removing said dummy oxide layer in said symmetric PMOS transistor area in a manner such that said dummy oxide layer under said PMOS ion implantation photoresist pattern in said DEMOS/LDMOS transistor area is not removed;

removing said PMOS ion implantation photoresist pattern;

forming a symmetric PMOS gate on said lower voltage gate dielectric layer in said symmetric PMOS transistor area; and forming symmetric PMOS source and drain regions in said substrate in said symmetric PMOS transistor area adjacent to said symmetric PMOS gate.

* * * * *